United States Patent [19]

Burns

[11] 4,209,355

[45] Jun. 24, 1980

[54] MANUFACTURE OF BUMPED COMPOSITE TAPE FOR AUTOMATIC GANG BONDING OF SEMICONDUCTOR DEVICES

[75] Inventor: Carmen D. Burns, San Jose, Calif.

[73] Assignee: National Semiconductor Corporation, Santa Clara, Calif.

[21] Appl. No.: 921,643

[22] Filed: Jul. 26, 1978

[51] Int. Cl.² .............................................. C23F 1/02
[52] U.S. Cl. ................................. 156/630; 29/576 S; 29/589; 156/252; 156/634; 156/645; 156/656; 156/661.1; 357/70
[58] Field of Search ................................ 156/629–634, 156/645, 650, 651, 656, 659, 661, 901, 902, 252, 269; 357/69, 70; 317/101 F; 174/52 PE, 68.5; 29/576 S, 577, 589, 591; 96/36.2, 38.4

[56] References Cited

U.S. PATENT DOCUMENTS

| | | | |
|---|---|---|---|
| 3,480,836 | 11/1969 | Aronstein | 317/101 R |
| 3,689,991 | 9/1972 | Aird | 29/577 |
| 3,763,404 | 10/1973 | Aird | 174/52 PE |
| 3,781,596 | 12/1973 | Galli et al. | 317/101 F |
| 3,795,043 | 3/1974 | Forlani | 29/574 |
| 3,962,002 | 6/1976 | Finkbeiner et al. | 156/634 X |
| 3,968,563 | 7/1976 | Hamlin | 29/576 S |
| 4,063,993 | 12/1977 | Burns | 156/659 |

Primary Examiner—William A. Powell
Attorney, Agent, or Firm—Gail W. Woodward; James A. Sheridan

[57] ABSTRACT

A composite tape product, employed in the gang bonding of semiconductor devices, is manufactured on an insulating strip that has a series of apertures therein. A plurality of metal fingers are bonded to the strip so that groups of fingers extend over the apertures. The finger ends terminate in a configuration where each finger mates with an integrated circuit bonding pad. A thermocompression bonding tool can then gang bond the fingers to the bonding pads. The tape mounted fingers then include the bonded chip and the tape can then carry the chip to the chip mounting and finger bonding operation. The composite tape is manufactured using mating prepunched or pre-etched insulating and metal strips. The metal strip is first partly etched to define the finger pattern. Then the metal and insulating strips are bonded together so that the partly defined finger patterns register with the prepunched insulating tap apertures. Then the finger etching is completed to form the composite tape that can be used in automatic assembly machines.

9 Claims, 9 Drawing Figures

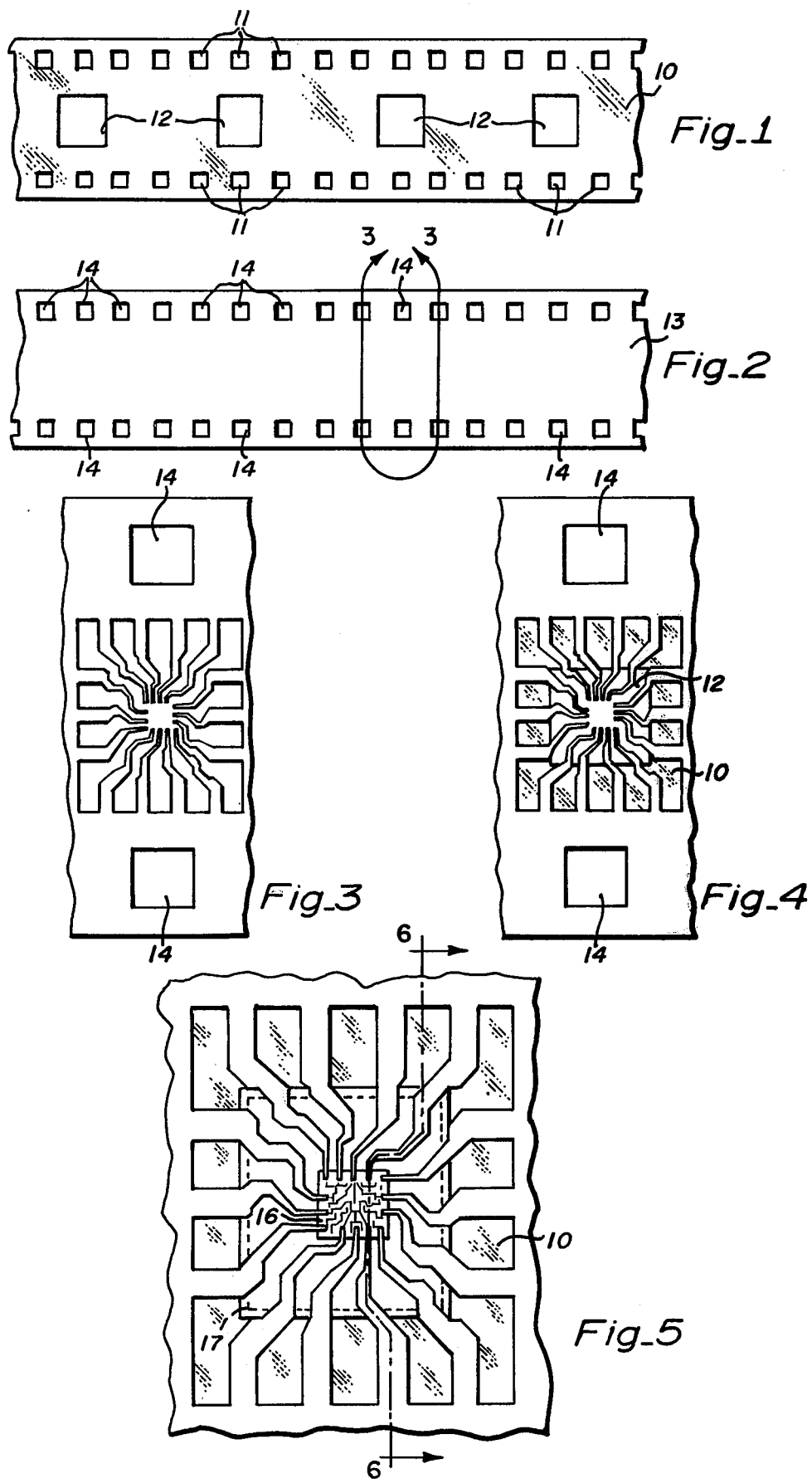

MANUFACTURE OF BUMPED COMPOSITE TAPE FOR AUTOMATIC GANG BONDING OF SEMICONDUCTOR DEVICES

BACKGROUND OF THE INVENTION

The fabrication processes used in making semiconductor devices have progressed rapidly to a point where highly complicated multifunction semiconductor chips can be reliably produced at a cost that is close to or even below the cost of a suitable housing. Accordingly, much attention has been given to automatic housing assembly processes. One of the more useful approaches is to fabricate a composite tape consisting of an insulating strip having a series of intermediate lead patterns located thereon. The lead pattern is in the form of metal fingers located on the insulating strip. The strip has indexing said transporting holes located along one or both edges. Indexed thereto are a sequence of lead pattern arrays. Each pattern has an array of conductive fingers, the inner ends of which are located so as to mate with the bonding pads normally employed to make connections to the conventional semiconductor chip devices. In current technology it is desirable to hold the positional tolerance of the metal fingers to 1 mil. Thus precision processing is required. The outer ends of the fingers extend to a position that registers with the conductors of the structure upon which the chip is to be mounted. This can be either a typical lead frame array useful in making transfer molded plastic housings or the pattern array on a printer wiring substrate such as is typically found in hybrid assemblies. The inner ends of the fingers are usually made to extend into an aperture prepunched in the insulating strip. The aperture is made slightly larger than the lead array of the semiconductor chip to be bonded.

In order to make chip contact the contacts are ordinarily bumped. In this approach the semiconductor chip, while still in wafer form, is processed to produce raised metal mounds or bumps on each of the bonding pads. This can be done by a combination of masking, metal deposition and metal etching. The bumps are typically gold or copper located on top of suitable metal barrier layers deposited on top of the conventional chip bonding pads. The metals are selected for low cost application, reliability, and ease of bonding. Typically the lead patterns are located in place over the bumped chips and are simultaneously thermocompression bonded to the bumps. The chip is then physically located and can be carried on the composite strip.

In typical high speed assembly the strips are fabricated in tape form that can be handled on reels. Automatic machinery can be used to fabriate the assembly tape. The tape can then be passed through an automatic chip bonder where each pattern picks up an associated chip. Then the tape is passed through an automatic machine that bonds the outer finger portions to either a lead frame or other substrate, again using thermocompression gang bonding.

U.S. Pat. Nos. 3,689,991 and 3,763,404 disclose a composite tape process. These patents disclose a prepunched insulating tape that has a layer of metal bonded thereto. The metal is then photolithographically etched to create the desired lead pattern.

Since the application of bumps to a semiconductor device involves cost and can adversely affect reliability, efforts have been made to bump the tape rather than the semiconductor device. U.S. Pat. No. 3,781,596 discloses a tape having a metal lead pattern wherein the inner ends of the fingers have a raised portion suitable for bonding to unbumped semiconductor chips. My copending application Ser. No. 921,642 filed July 3, 1978 and titled CONTROLLED COLLAPSE THERMOCOMPRESSION GANG BONDING discloses and claims an improved bumped tape.

To overcome some of the problems that attend the composite tape fabrication, the approach developed in my U.S. Pat. No. 4,063,993 has been employed. Here a copper tape is supplied with deposited rings of insulation to support the lead pattern which is etched into the copper tape.

The prior art approaches have proved to be useful but many problems still exist. It would be desirable to further lower cost, increase reliability, and increase production rates. It would further be desirable to employ a process that is amenable to the production of bumped tape having a suitable bump configuration as disclosed in my above mentioned copending application.

SUMMARY OF THE INVENTION

It is an object of the invention to provide a composite tape fabrication process wherein a metal strip is partly etched to create a lead pattern and is then bonded to a mating insulating strip, after which the etching is completed to create a composite tape.

It is a further object of the invention to fabricate a composite tape in which the metal laminate is first partly etched and then laminated to an insulating support, after which the etching is completed, whereby the two sides of the metal tape can be etched differently.

It is a feature of the invention that suitably bumped composite tape can be fabricated in a precision high speed process.

These and other features and objects can be achieved as follows. An insulating strip is first coated with a thermal setting adhesive and a strippable protective coating. This assembly is then prepunched to create a row of index holes along both edges. These holes will be used to transport the tape and index it during subsequent fabrication operations. A row of apertures are also prepunched along the tape in registry with the index holes.

A copper strip having the same width as the insulating strip is prepunched or pre-etched to have similar index holes along its edge. The copper strip is then coated with photoresist on both faces and exposed for photolithographic etching. The photoresist on one side of the strip is developed and the exposed copper etched part way through the strip. The resist on the etched face is then removed.

The protective coating on the insulating strip is then removed and the etched face of the copper strip is bonded to the insulating strip via the adhesive layer. The photoresist on the other side of the copper strip is developed and the exposed copper etched completely through the strip. This leaves the separate leads in the pattern securely bonded to the insulating tape and arrayed to extend in the desired form over the apertures. Alternatively the copper strip can be etched simultaneously from both sides to create the finger pattern, but the etching is stopped before penetration is complete. This leaves a thin web of metal joining the fingers. Then the copper is bonded to the insulating strip and the thin web etched away.

The two-sided etching results in a metal pattern having the desired shape for an improved rigidity cantilever finger mounting that allows easy thermocompression bonding to the semiconductor. The two-sided etching further permits bump formation on one side of the copper tape, and this operation can be controlled for optimum bump formation. In addition to the bumps at the finger ends, bonding bumps can be etched into the fingers where they are to be bonded to the support structure. All of the etching can be accomplished using a single resist application and simultaneous two-sided resist exposure. Thus the desired ±0.25 mil registration between the bump and the finger end can be obtained using state of the art photolithography. Thus, successive resist applications and exposure registrations are avoided.

BRIEF DESCRIPTION OF THE DRAWING

FIG. 1 shows a section of punched insulating strip;

FIG. 2 shows a section of punched metal strip;

FIG. 3 shows one finger pattern etched into the metal strip;

FIG. 4 shows a single finger pattern in an etched composite tape;

FIG. 5 shows a chip bonded to a single metal finger pattern;

DESCRIPTION OF THE INVENTION

Figure 6:
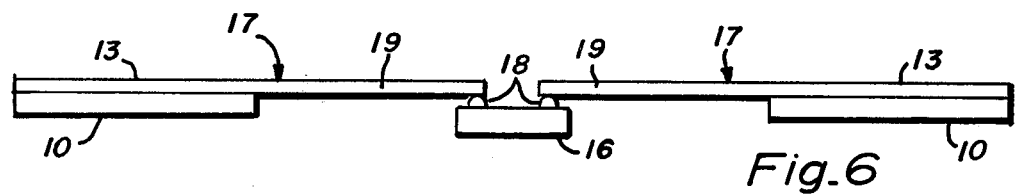
FIG. 6 is a cross section view of the tape of FIG. 5.

The automatic assembly tape is produced as follows. An insulating tape is fabricated starting with a strip of polymer film material. A suitable material is available from DuPont as Kapton polyimide film. A 5-mil thick film is first coated with a 0.5-mil layer of B-staged epoxy adhesive. A 1-mil thick film of polymer film material such as DuPont Mylar polyester film is applied over the adhesive to act as a protective strippable coating. The composite insulating strip material is prepunched in accordance with the pattern of FIG. 1. A series of holes 11 is punched out along the edge of strip 10 and a series of apertures 12 is punched out of the center portion of the tape. Holes 11 will act to provide indexing and tape transporting. Apertures 12 are indexed with respect to holes 11 and are made slightly larger than the metal conductor pattern to be used to interconnect the semiconductor chip to its mounting device.

FIG. 2 illustrates a prepunched strip of copper 13. Holes 14 are punched or etched to mate with holes 11 of strip 10 and both strips have the same width. It is to be understood that strips 10 and 13 can be handled in any one of several forms. The strips can be used in the form of controlled length sections or they can be handled in reel form in virtually any desired length. The operations to be described can be applied in a continuously operating sequence or they can be applied in batches where a given number of positions on a strip are simultaneously treated.

In the photoresist processing to be described either one of two conventional processes can be used. In the first the conventional photoresist technique is employed. The resist is applied and exposed so that after development the surface to be etched is exposed while hardened resist covers the areas not to be etched. Then the etchant is applied as desired. In the second method the resist is applied and exposed so that after development the metal is exposed only where it is to be retained. This is the opposite of the first method. Then a metal is plated on the exposed surfaces and the photoresist removed. The metal is selected to be insoluble in the etch used in treating strip 13. For example in etching copper a layer of 25 to 50 microns of nickel is applied. This nickel layer will then act as a resist during the copper etch. After the copper etch is completed the nickel resist can be removed if desired in an etch that selectively attacks nickel but not copper.

This second method has the advantage of an etch resist that is not affected by high temperature processing which could destroy a conventional organic photoresist layer.

Thus in the photolithographic etching to be described hereinafter, where the term etch resist is used it can mean either metal or organic etch resistant material.

Copper strip 13 is desirably a 3.1 mil thick sheet of conventional copper alloy 110. Partial or full hardness can be employed, but it is preferred to fire the alloy to about ¼ hardness. Generally speaking, a rolled copper product is preferred, so that after semiconductor bonding and heat treatment a homogenous fine grain crystal structure is present.

The copper strip 13 is cleaned and coated on both faces with photosensitive etch resist. If desired the copper can be pretreated with well-known photoresist adhesion promotion materials. One face is then exposed, developed, and etched to produce the pattern of FIG. 3, which is an enlarged portion of strip 13 of FIG. 2. Only two holes 14 are shown and the pattern shown is indexed thereto. If desired the fingers can be etched so as to produce bumps at the inner extremities. Etching is continued until it extends about halfway through the metal, so as to leave a raised pattern.

At this point the protective film on strip 10 is removed and the partly etched copper strip face laminated against the epoxy adhesive. This operation employs holes 11 and 14 for indexing and the epoxy adhesive is set by a hot pressing operation. This operation is disclosed and claimed in my copending application Ser. No. 921,644 filed July 3, 1978 and titled APPARATUS AND PROCESS FOR LAMINATING COMPOSITE TAPE, now abandoned. After lamination the metal exposed inside apertures 12 is covered with an etch protective material such as stop-off lacquer.

The resist on the other face of strip 13 is exposed with a precisely indexed mirror image of the pattern of FIG. 3. The photosensitive resist is developed and the exposed copper etched to complete the finger pattern as shown in FIG. 4.

Alternatively the above fabrication process can be modified as follows. The copper strip is first etched on both faces but not completely. A thin web of metal (about 0.5 mil) is left in the region between fingers. Then the copper strip is laminated to the insulating strip as described above and the metal exposed inside apertures 12 covered with stop-off lacquer. Then the exposed metal face is etched to remove about 0.5 mil of metal, thus removing the thin web and leaving the finger pattern of FIG. 4. The copper finger pattern is securely adhered to strip 10 and aperture 12 is in registry with the inner ends of the fingers. It has been determined that either of above-described processes will permit locating the ends of the fingers relative to the holes 14 to a tolerance of ±1 mil.

FIG. 5 shows a semiconductor chip 16 thermocompression bonded to the structure of FIG. 4. Dashed line 17 is an excise line where the metal pattern can be severed from the tape thereby producing a chip with an attached copper lead pattern. The outer ends of the lead pattern can then be thermocompression bonded to the ultimate device mounting structure.

FIG. 6 is a cross section of the structure of FIG. 5. Chip 16, which has been provided with raised bumps 18, is thermocompression bonded to the outer tips of the metal fingers 19. The chip along with fingers 19 can then be removed by shearing at excise points 17.

Figure 7:
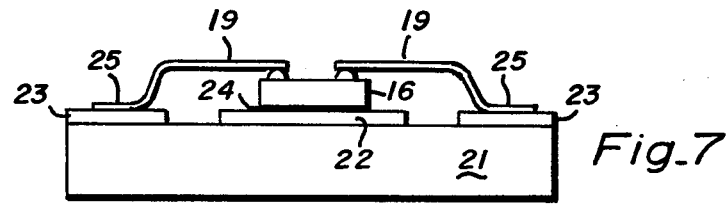
FIG. 7 is a cross section of the chip and finger portion of the device of FIG. 6 mounted upon a hybrid substrate.

If desired, the chip can be employed as shown in FIG. 7. Here a ceramic carrier 21, as commonly used in hybrid construction, has located thereon a metal pad 22 and printed wiring lands 23. Chip 16 is soldered or otherwise bonded at 24 to pad 22 and leads 19 are thermocompression bonded at 25 to wiring 23.

Figure 8:
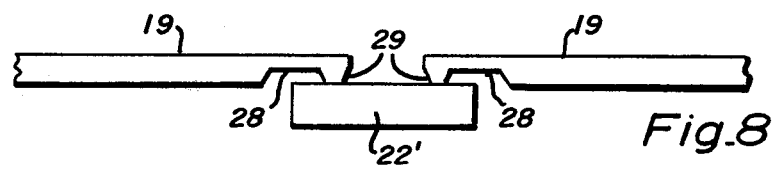
FIG. 8 shows bumped fingers bonded to a chip.

FIG. 8 shows an alternative lead shape that can be accommodated by the process of the invention. This construction renders the tape process compatible with conventional unbumped semiconductor chips. In the etching step of strip 13 the photosensitive resist exposure step is arranged so that the etching produces a bump at the end of the copper fingers. In the exposure step for the underside of strip 13 the resist is exposed in a pattern that will result in resist removal in regions 28. The resist is retained over a small area at the end of the metal pattern so that during etching a bump of copper 29 is left on the underside of the metal adjacent to a thinned portion. The details of bumped tape are set forth in my above-mentioned copending patent application Ser. No. 921,642 filed July 3, 1978. This copper bump permits the metal to be thermocompression bonded to an umbumped or conventional semiconductor chip 22' as shown. After bonding, the chip plus metal assembly is handled conventionally. While not shown, the fingers can also be bumped at bond points 25 to facilitate bonding.

Figure 9:
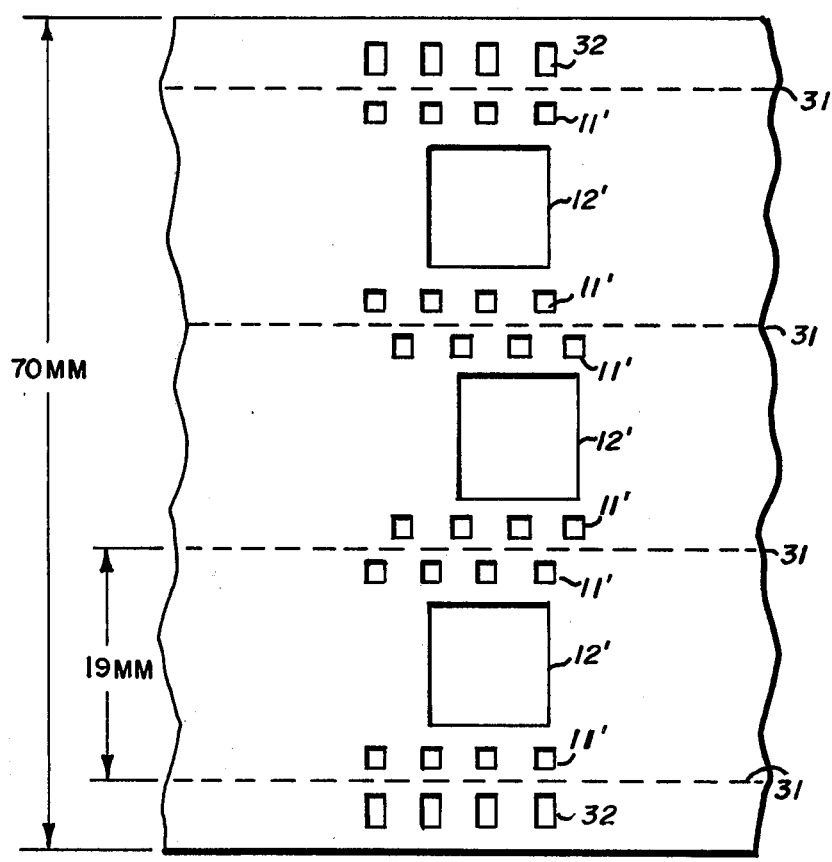
FIG. 9 shows a tape pattern using plural rows of patterns.

FIG. 9 shows a tape embodiment useful in high speed composite tape manufacture. Three 19 mm tapes are fabricated simultaneously in a 70 mm tape format. While only three patterns are shown extending across the tape, it is to be understood that these patterns will be repeated at intervals along the length of the tape, thereby to create three separate tapes simultaneously. After the composite tape is processed as described above, the tape is slit along lines 31 to produce three separate tapes which can be spliced end to end, if desired, to create a single long tape. Two rows of sprocket holes 32 are used to index and transport the wide tape. The process employed is as was described in connection with FIGS. 1 through 4. The prepunched insulating tape would include holes 32, the rows of holes identified as 11', and apertures 12'. It will be noted that the central tape section is offset slightly from the two outer sections to stagger the relationship of holes 11'. This feature, while not necessary, may prove to be desirable. The copper strip would be prepunched or etched to include holes 32 and 11'. The two strips are processed as described above. Then after laminating and final etching, the tape is slit along lines 31. This latter approach has the advantage of increasing productivity and the indexing and transporting holes 32 used to make the tape are not used once the tape is manufactured. Thus when holes 11' are used to bond the semiconductor chip to the lead pattern, the holes have not been distorted by previous usage. These virgin indexing and transporting holes will provide maximum accuracy in the chip bonding operation.

ALTERNATIVE EMBODIMENT

The above-described composite tape-making process represents the preferred embodiment. However, the alternative embodiment to be described represents a second method having substantial utility and with time could prove to be preferred.

The insulating strip of FIG. 1 is prepared and prepunched as was described above. The conductive strip is treated differently. The prepunched strip of FIG. 2 having a nominal thickness of about 2.6 mils is first cleaned. Then a laminate of dry photosensitive resist is applied. A suitable material is available from DuPont as Riston dry film resist on a Mylar polyester backing. The resist side of this material is hot rolled at about 125° C. onto the clean copper surface which may be pretreated to promote resist adherence if desired. Both faces of the strip are covered. The two faces are then exposed to the desired optical pattern.

The protective polyester film is then stripped off of the lower face of the metal strip and the resist developed. The metal is then etched to remove about 1.3 mils of metal. The resist remaining on the etched side is then removed. At this point the protective polyester film is stripped from the insulating strip 10 (of FIG. 1) and the etched side of the metal strip laminated to the adhesive coated side of the insulating strip as described above. Then the metal exposed inside apertures 12 are covered with etch resist stop off lacquer. The protective polyester is then stripped from the resist on opposite face of the metal and the thus exposed resist developed. The exposed copper is then etched to remove about 1.3 mils of material, thereby completing the metal pattern of FIG. 4. The remaining resist is then removed and the completed composite tape is ready for further assembly processing.

In a typical operation, the metal that extends inside the insulating strip apertures is carefully cleaned and electroplated with a thin layer of gold, or a thin layer of nickel overcoated with gold, which acts to prevent corrosion of the copper and promote the thermocompression bonding of the leads. At this point, the composite tape is either stored to be used later or used directly in the assembly process.

The invention and some alternatives have been disclosed and the processes detailed. There are other alternatives and equivalents that will occur to a person skilled in the art. Accordingly, it is intended that the invention be limited in scope only by the claims that follow.

I claim:

1. A process for fabricating a composite tape suitable for assembling semiconductor chip devices, said tape comprising an insulating strip having edge located indexing and transporting holes, a succession of apertures indexed relative to said edge located holes, and a plurality of conductive members, each conductive member being secured at one end to said insulating strip and having a free end extended in cantilever fashion into said aperture, the free ends of said plurality of conductive members being held in relative positions that permit simultaneous attachment to said semiconductor chip, said process comprising the steps of:

preparing a first strip of insulating material to create edge located holes for indexing and transporting said first strip and a succession of apertures located in spaced relation along said first strip, said apertures being indexed in predetermined relation with said edge located holes;

preparing a second strip of conductive material having a width substantially equal to the width of said first strip to create edge located holes that are capable of registry with said edge located holes in said first strip;

etching said second strip to create said plurality of conductive members and halting said etching before said second strip is completely penetrated, thereby leaving said plurality of conductive members joined together by a thinned web of metal;

laminating said first and second strips together using said edge located holes to index said first and second strips with respect to each other to create a composite strip; and etching said composite to remove said thinned web, thereby leaving said plurality of conductive members on said insulation strip and extending in cantilever fashion into said aperture.

2. The process of claim 1 wherein said etching of said second strip includes the steps of:

etching a first surface of said second strip to a depth of about one half of the thickness of said second strip;

laminating said etched first surface to said first strip; and etching said second surface in a pattern in registry with the etched pattern in said first surface until said second strip is completely penetrated in the regions to be etched.

3. The process of claim 2 wherein said etching of said second surface is preceded by coating that portion of said first surface exposed in said apertures with an etch resist.

4. The process of claim 3 wherein the etched patterns on said first and second surfaces are different whereby said conductive members are thickness contoured.

5. The process of claim 1 wherein said etching of said second strip includes the steps:

etching both sides of said second strip simultaneously to produce a pattern in said strip;

stopping said etching prior to complete penetration of said strip thereby to leave said pattern in said strip joined together by a thin web of metal;

laminating said etched second strip to said insulating strip to create a composite; and etching said composite to remove said thin web of metal.

6. The process of claim 5 wherein said etching of said composite is preceded by coating that portion of said second strip exposed inside said aperture in said first strip with an etch resist whereby said etch of said composite is confined to the unlaminated face of said second strip.

7. The process of claim 6 wherein said etch of said composite is nonselective.

8. The process of claim 1 wherein said strips have a plurality of edge holes for indexing and transporting said tape during its manufacture and said tape includes a plurality of rows of patterns and apertures each row having separate indexing and transporting holes indexed to said apertures.

9. The process of claim 8 further including the step of severing said tape to produce a plurality of composite tapes.

* * * * *